(12) United States Patent
Chidambarrao et al.

(10) Patent No.: US 7,439,123 B2
(45) Date of Patent: Oct. 21, 2008

(54) LOW RESISTANCE CONTACT SEMICONDUCTOR DEVICE STRUCTURE

(75) Inventors: Dureseti Chidambarrao, Weston, CT (US); William K. Henson, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 11/263,261

(22) Filed: Oct. 31, 2005

(65) Prior Publication Data

US 2007/0099362 A1    May 3, 2007

(51) Int. Cl.
    H01L 21/00    (2006.01)
(52) U.S. Cl. .................. 438/231; 438/305; 438/592; 257/E21.63
(58) Field of Classification Search .......... 438/592, 438/683, 231, 305; 257/E21.63
    See application file for complete search history.

(56) References Cited

U.S. PATENT DOCUMENTS

| 5,217,924 A | * | 6/1993 | Rodder et al. ............ 438/301 |
| 5,258,637 A | | 11/1993 | Sandhu et al. |
| 5,593,923 A | | 1/1997 | Horiuchi et al. |
| 5,624,867 A | | 4/1997 | Cheng et al. |
| 5,654,241 A | | 8/1997 | Kakumu |
| 5,891,784 A | * | 4/1999 | Cheung et al. ............ 438/303 |
| 5,899,741 A | | 5/1999 | Tseng et al. |
| 6,069,044 A | | 5/2000 | Wu |
| 6,156,615 A | | 12/2000 | Kepler |
| 6,232,220 B1 | | 5/2001 | Penka et al. |
| 6,242,312 B1 | | 6/2001 | Huang et al. |
| 6,319,785 B1 | | 11/2001 | Ha et al. |
| 6,387,803 B2 | | 5/2002 | Talwar et al. |
| 6,492,264 B2 | | 12/2002 | Oda |
| 6,746,944 B1 | | 6/2004 | Xiang et al. |
| 6,930,030 B2 | | 8/2005 | Rausch et al. |
| 2002/0098689 A1 | | 7/2002 | Chong et al. |
| 2002/0102805 A1 | | 8/2002 | Cheng et al. |

OTHER PUBLICATIONS

Jeong Su Han et al., "Improvement of P+ Contact Resistance through Optimal Boron Distribution on TiSi2/ P+ Interface for 0.18 μm DRAM Technology and beyond", IEEE, 2000, pp. 83-86.

S.M. Sze, ed., "VLSI Technology, Second Edition", New Jersey: McGraw-Hill Publishing Company, 1988, pp. 362-365 (attention to paid to p. 365, first complete paragraph).

* cited by examiner

*Primary Examiner*—Richard A. Booth
(74) *Attorney, Agent, or Firm*—Joseph P. Abate

(57) ABSTRACT

A method for making a semiconductor device structure includes producing a substrate having formed thereon a gate with spacers, respective source and drain regions adjacent to the gate and an; disposing a first metallic layer on the gate with spacers, and the source and drain regions, disposing a second metallic layer on the first metallic layer; doping the first metallic layer with a first dopant through a portion of the second metal layer disposed over the second gate with spacers; and then heating the intermediate structure to a temperature and for a time sufficient to form a silicide of the first metallic layer. This first layer is, for example, Ni while the second layer is, for example, TiN.

7 Claims, 5 Drawing Sheets

US 7,439,123 B2

LOW RESISTANCE CONTACT SEMICONDUCTOR DEVICE STRUCTURE

FIELD OF THE INVENTION

The present invention relates to methods for making Metal Oxide Semiconductor (MOS) device structures and, more particularly, to using implants for making MOS Field Effect Transistors (e.g. nFETs, pFETs) having gate contacts with low resistance, and to the resulting structures.

BACKGROUND OF THE INVENTION

MOSFETs and various methods of their manufacture are well known. Typically, a MOSFET includes source and drain regions at a surface formed in or on a suitable substrate, and a gate disposed therebetween. Silicide electrical layers or contacts are formed on the gate, and on the source and drain regions. Substrates include, for example, bulk semiconductor (e.g. silicon), silicon-on-insulator substrates (SOI), among other substrates. See, for example, U.S. Pat. No. 6,930,030 B2, METHOD OF FORMING AN ELECTRONIC DEVICE ON A RECESS IN THE SURFACE OF THIN FILM OF SILICON ETCHED TO A PRECISE THICKNESS, issued Aug. 16, 2005, Rausch et al. which is hereby incorporated in its entirety by reference. FIG. 2M of the '030 patent, partially reproduced as FIG. 9 herein, shows the silicide layer/contact 54 disposed on a top surface of a polysilicon gate 4 of an nFET 20 formed in an SOI substrate. Also shown are an oxide layer 42 disposed below the gate and spacers 48 disposed at sidewalls of the gate.

It is also known to reduce electrical resistance of certain materials by means of using conductive type implants/dopants. See, for example, the following United States Patents: amorphization implants (U.S. Pat. No. 5,593,923), laser annealing to form silicide in combination with amorphizing implants (U.S. Pat. Nos. 6,387,803, 6,746,944B1), Ge implants (U.S. Pat. No. 5,258,637), implanting Flouride (U.S. Pat. No. 6,232,220B1), retrograde implants (U.S. Pat. No. 6,156,615), implanting metal into silicon (U.S. Pat. No. 5,654,241), amorphous silicon deposition (U.S. Pat. No. 5,899,741) and then metal/silicide formation, or implanting through silicide (U.S. Pat. No. 6,319,785) formed inside a contact hole which adds a mask, and silicon rich metal deposition (U.S. Pat. No. 6,492,264B1).

However, the present inventors believe that the methods and resulting structures according to the prior art have not proven to be entirely satisfactory. Silicide contact resistance is sensitive to the dopant concentration at the silicide/silicon (in both the, lateral extension and vertical source/drain) boundary. In general, the typical known silicidation process is as follows: source/drain implants are done followed by metal deposition and then an anneal to react the metal and doped silicon to form the silicide; as the reaction progresses, the dopant in the silicon is incorporated with large segregation into the silicide and causes the dopant concentration at the silicide/silicon interface to be low. This results in a relatively large contact resistance such as 100-200Ω-μm. A large contact resistance is typically undesirable.

The present inventors believe improvements are achievable in making low resistance silicide contacts for semiconductor device structures such as FETs.

SUMMARY OF THE INVENTION

It is a principal object of the present invention to provide a method for lowering silicide contact resistance which is readily compatible with conventional processes for making semiconductor device structures.

It is another object of the present invention to provide a semiconductor device structure including a gate contact having a very low contact resistance.

According to the present invention, a method for making a semiconductor device structure includes providing a substrate having formed thereon a gate with spacers and source and drain regions adjacent to the gate; disposing a first metallic layer on the gate with spacers and on the source and drain regions; disposing a second metallic layer on the first metallic layer; introducing a dopant into the first metallic layer through the second metallic layer; and then annealing the structure to form a silicide layer of the first metallic layer.

An important aspect of the present invention is introducing (e.g. implanting) a suitable dopant (e.g. N-type or P-type, as appropriate) in a metal layer/contact before a silicide of the metal is formed by, for example, a suitable conventional annealing process. As a result, the dopant concentration in the metal is large—for example, approximately 1.0E21 final concentration. Upon reacting the metal and silicon, the dopant concentration in the newly formed silicide comes from both sides of the boundary (the metal and silicon boundary) and the amount of dopant loss from the silicon side into the silicide is limited. The method of the present invention allows larger dopant concentrations in the silicon at the silicide/silicon boundary with much better (lower) contact resistances.

Further and still other objects of the present invention will become more readily apparent when the following detailed description is taken in conjunction with the following drawings, in which:

DETAILED DESCRIPTION OF THE PREFERRED EMBODIMENT

A preferred embodiment and best mode of the present invention will now be described with reference to FIGS. 1-8, for making a semiconductor device structure including an nFET and pFET. However, it is understood by those skilled in the art in view of the instant disclosure that Applicant's method is applicable broadly to making only one device, such as an nFET or pFET.

Figure 1:
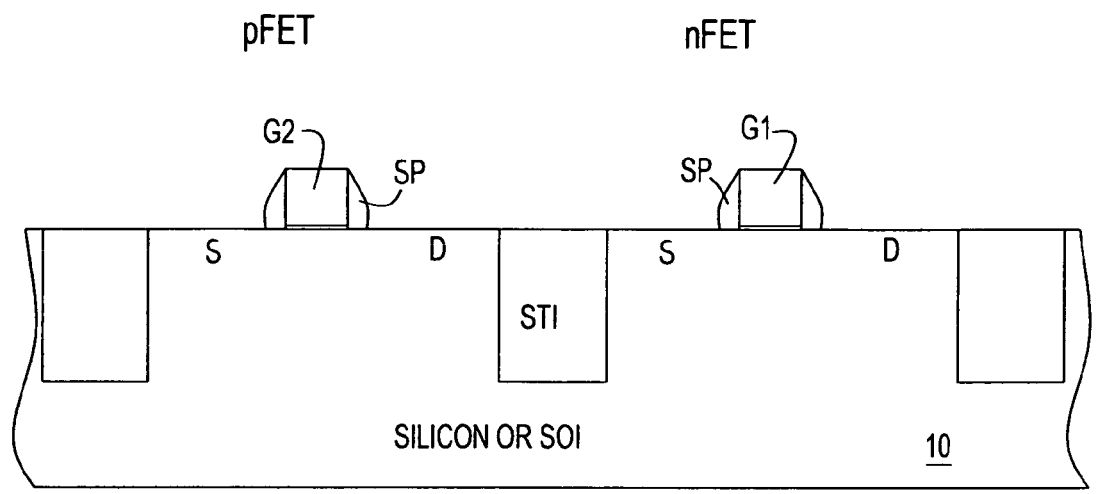
FIG. 1 through FIG. 6 are side schematic views of sequential structures resulting from the various sequential steps according to one preferred embodiment of Applicant's invention, when used to make a two device semiconductor structure including an nFET and a pFET.

Firstly, with references to FIG. 1, produce a substrate which has formed thereon a first gate G1 with sidewall spacers SP, a second gate G2 with sidewall spacers SP, respective and suitably implanted source and drain regions S, D formed adjacent to the first gate and the second gate, and an isolation region STI disposed intermediate of the first gate G1 and the second gate G2.

The semiconductor substrate is a bulk Si substrate, an SOI substrate, or a stressed (strained) Si substrate. Alternatively, the substrate is a hybrid substrate which includes more than one surface orientation. The substrate alternatively includes a semiconductor material other than Si, such as Ge or any combination of Group III-V elements or Group II-V elements.

After an initial substrate cleaning procedure (conventional), an isolation scheme is carried out. As is well known in semiconductor manufacturing, the isolation scheme is used to separate selected devices electrically from each other. The isolation scheme may be a standard or a modified shallow trench isolation (STI) scheme. The STI is shown in FIG. 1. Alternatively, the isolation is accomplished using a LOCOS process or mesa isolation scheme, as is well known in the art of fabricating semiconductor devices. For various known or conventional processes for fabricating semiconductor devices, see VLSI Technology, $2^{nd}$ Edition, by S. M. Sze, (McGraw Hill Publishing Co., 1988).

After the isolation STI is formed, a conventional gate oxide pre-cleaning process is performed. As is the case in high performance logic fabrication processes, various conventional gate oxide processes may be used to fabricate devices having different gate oxide thicknesses. The gate oxide 3 is formed, for example, using a conventional thermal oxidation process. The oxide 3 is formed using $N_2O$, NO, $O_2$ or any combination of them. The oxide may be nitridized using a conventional plasma process. Alternatively, the gate oxide may be formed using a base oxide followed by deposition of a high k gate dielectric such as aluminum oxide, or hafnium oxide, or another high k gate dielectric. The gate dielectric material 3 has an approximately (+10%) uniform thickness in the range of about (+10%) 0.6 nm to about 7 nm.

Next, the gates G1, G2 are conventionally formed. Each gate G1, G2, preferably, is formed from a polysilicon layer (not shown) deposited by low pressure chemical vapor deposition (LPCVD) using a reactant gas such as silane ($SiH_4$). The thickness of the layer is between about 1000 and 3000 Angstroms. The layer is then conductively doped N⁻type by ion implanting arsenic ($As^{75}$) or phosphorus ($P^{31}$). The final dopant concentration of the layer after implantations is preferred between about 1.0 E 18 and 1.0 E 21 ions/$cm^3$. Conventional photolithographic techniques and anisotropic plasma etching are used to pattern the polysilicon layer which includes forming gate electrodes G1, G2 over the device areas. The polysilicon layer is plasma etched using reactive ion etching (RIE) or a high density plasma (HDP) etching and an etchant gas, such as chlorine ($Cl_2$).

After removing the photoresist mask not shown, for example by plasma ashing in oxygen ($O_2$), lightly doped source/drain (LDD) or extension areas are formed in the device areas adjacent to said gate electrodes by ion implantation, using a second conductive type dopant, such as As or P. Polysilicon sidewall reoxidation or offset spacers could be used to offset the LDD implants. Typically the LDD areas are doped to a concentration of between about 1.0 E 19 and 5.0 E 20 atoms/$cm^3$. Next, a conformal insulating layer (not shown) is deposited and anisotropically plasma etched back to form sidewall spacers SP on the sidewalls of the gate electrodes. Typically the insulating layer is silicon oxide ($SiO_2$) and is deposited by low pressure CVD (LPCVD) using tetraethosiloxane (TEOS) as the reactant gas, and is deposited to a preferred thickness of about 200 to 1000 Angstroms. Other options include nitride spacers or a combination of multiple spacers with nitride and oxide materials.

An etch back is carried out using RIE and an etchant gas such as carbon tetrafluoride ($CF_4$) and hydrogen $H_2$ or methylfluoride ($CHF_3$), which etches the $SiO_2$ layer selectively to the silicon substrate and polysilicon gate electrode. Heavily doped source/drain contact areas are then formed in the device areas adjacent to the insulating sidewall spacers by ion implanting a second conductive type dopant, such as arsenic. The contact areas are doped to a final concentration of 1.0 E 18 and 1.0 E 21 atoms/$cm^3$. Any residual native oxide remaining on the source/drain contact areas and the exposed top surface of the polysilicon gate electrodes is removed using a dip etch in a dilute hydrofluoric acid solution.

The foregoing description for FIG. 1 is with respect to the nFET region. It is understood by those skilled in the art that the polarity of dopants is reversed for the pFET region, and that conventional masking, patterning etc. are required during processing.

Figure 2:
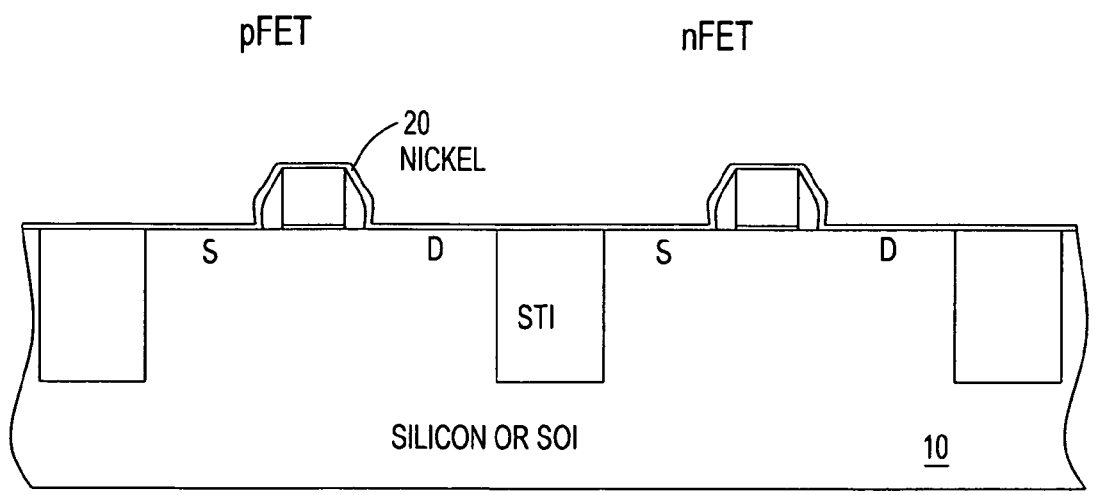

Next, referring to FIG. 2, a first conformal metal layer is deposited on the substrate. The metal is preferably nickel (Ni) or cobalt (Co) and is deposited to a thickness of between about 40 and 100 Angstroms. For example, the Ni can be deposited by physical sputter deposition.

Figure 3:
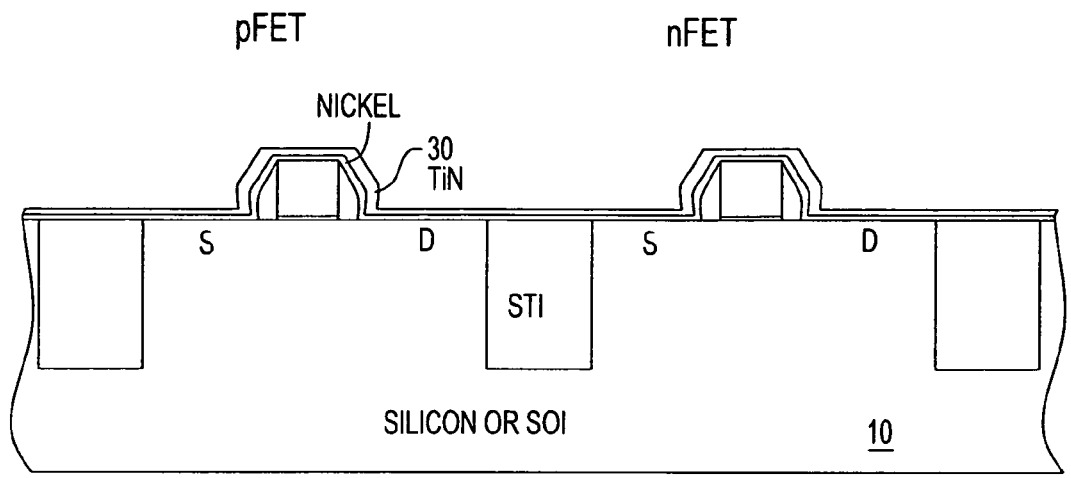

Next, referring to FIG. 3, a second conformal metallic layer, preferably TiN, is deposited on the first metallic layer. The second conformal metallic layer is preferably TiN and is deposited to a thickness between about 10 and 50 Angstroms. The second metallic layer can be deposited with identical conventional deposition techniques as the techniques used for first metallic layer. A purpose of the second metallic layer is to provide a buffer layer for the implant wherein the energy can be increased so that the known conventional implanters can be used. In addition, this approach will require lithography steps to be performed. The photoresist removal is typically performed with an O2 plasma etch which will result in oxidation of the metal. TiN is an excellent barrier to block the oxidation of the first metal layer during the resist strips after the implantation into the metal layers.

Figure 4:
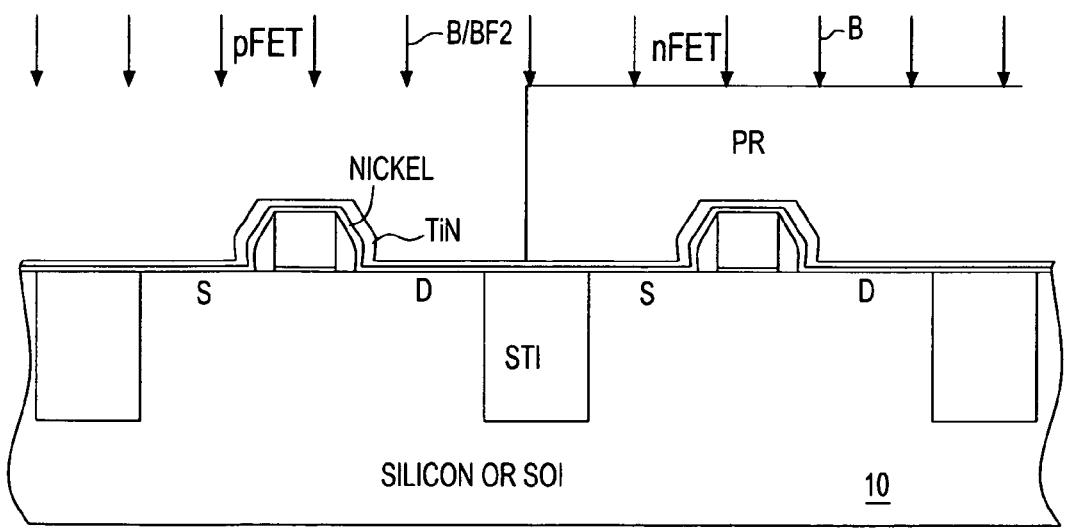

Next, conventionally deposit any standard positive photoresist used in conventional CMOS processing pattern, remove (by etch) resist from the pFET region as shown in FIG. 4. A conventional dopant such as B or BF2 is introduced into the Ni layer through a portion of the TiN layer disposed over the second gate G2 with spacers SP. The energies preferably are B: 0.3 KeV to 3 KeV, BF2: 2 KeV to 5 KeV, with doses of about 1E15#/$cm^2$ to 5E15#/$cm^2$.

Figure 8:
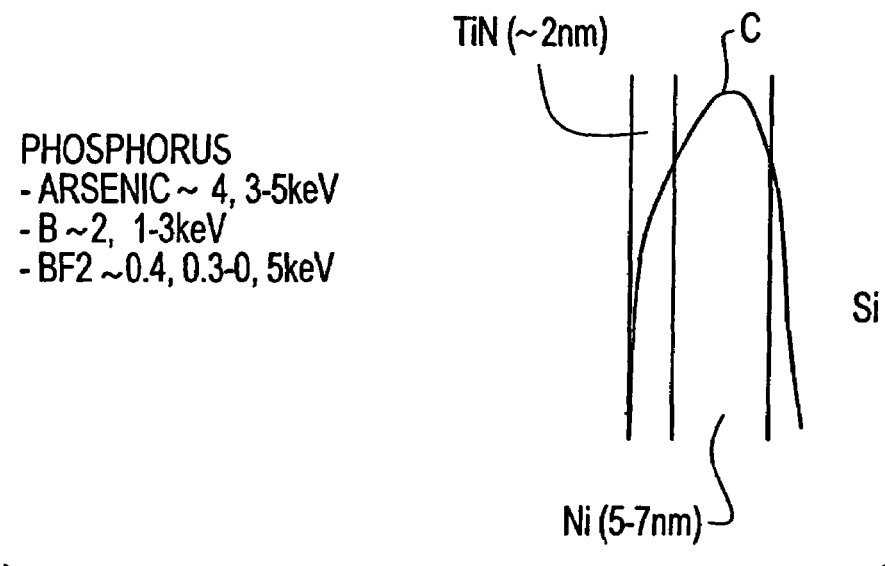
FIG. 8 is a diagram showing the dopant concentration C resulting from doping according to each of FIG. 4 and FIG. 5.
Figure 9:
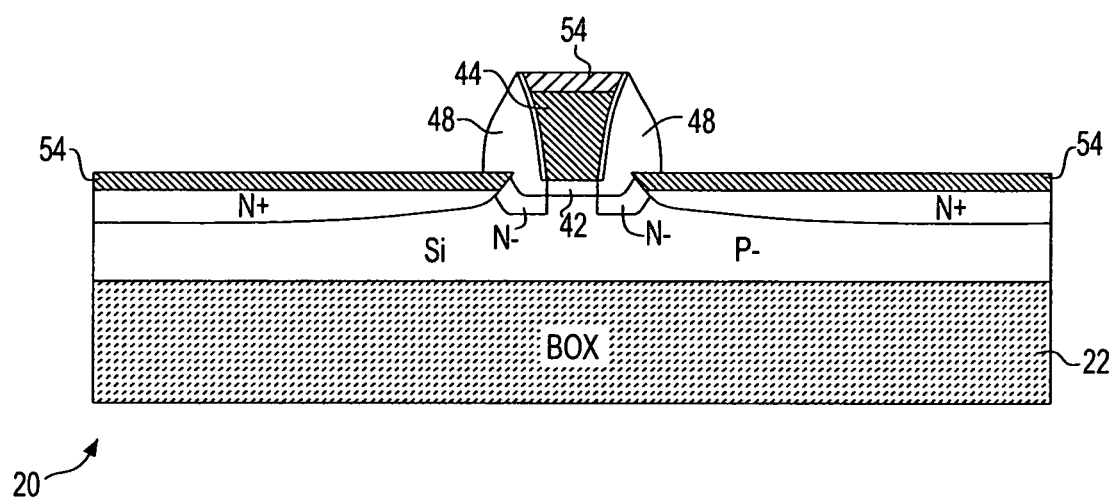
FIG. 9 is a side schematic view of an nFET according to the prior art.

After implantation, the dopant concentration in the Ni layer is approximately as shown in FIG. 8. FIG. 8 shows a high concentration (approximately 1E21) of dopant at the Ni/silicon interface. To recapitulate, an important feature of the present invention is to implant a suitable dopant into the metal (Ni) itself.

Figure 5:
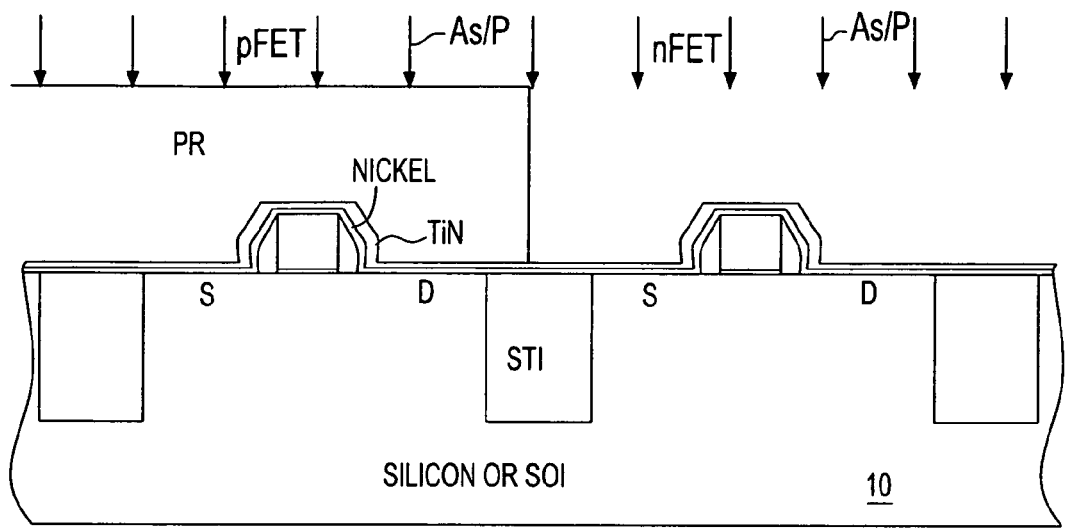
Figure 6:
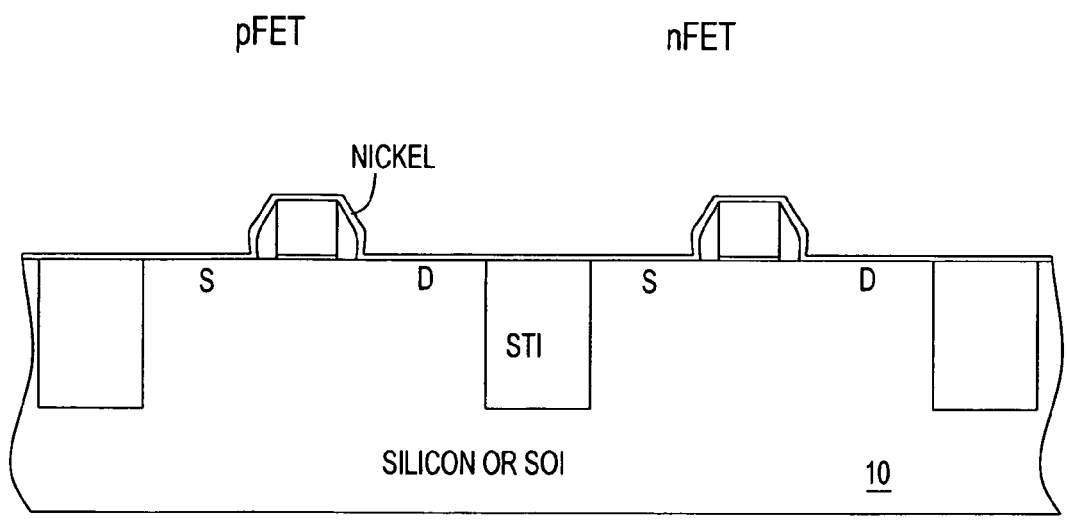

Next, the mask PR is removed (e.g. suitably etched) from the NFET region. Then, conventionally deposit a photoresist over the entire structure, pattern, etch resist from NFET region as shown in FIG. 5. A conventional N-type dopant such as As or P is introduced into the Ni layer through a portion of the TiN layer disposed over the first gate G1 with spacers SP. The energies preferably are As: 2 KeV to 5 KeV, P: 1 KeV to 3 KeV, with doses of about 1E15 #/$cm^2$ to 5E15#/$cm^2$ Next, the photoresist is conventionally etched from the pFET region. Then, the TiN may be partially removed if desired from the entire structure, to result in the structure shown in FIG. 6.

The resultant structure (FIG. 6) has implanted dopants in the Ni layer: B/BF2 in the pFET region; As/P in the nFET region.

Figure 7:
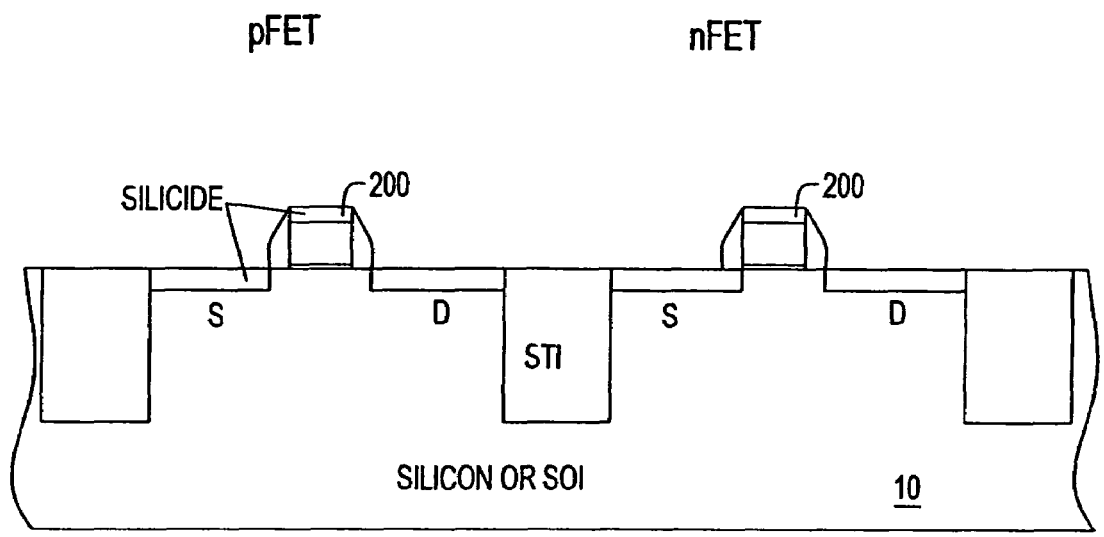
FIG. 7 is a side schematic view of a final semiconductor device structure according to the present invention.

The structure (FIG. 6) is then suitably conventionally heated or annealed such as with the following annealing parameters:
A) gases: N2
B) temperature range: 350 C-500 C
C) time period: 5 sec-5 min These annealing parameters constitute values which are representative for Ni, but other well know annealing conditions are used for other metal silicides. The annealing forms a silicide of the Ni layer. The second metallic layer is then removed (eg. suitably etched with HF). After excess metal is stripped from the spacers SP and the STI region, a final structure results as shown in FIG. 7. The final dopant concentration in the Ni layer is as high as 1 E 21 atoms/cm$^3$ see FIG. 8.

While the invention has been particularly shown and described with reference to the preferred embodiments thereof, it will be understood by those skilled in the art that various changes in form and details may be made without departing from the spirit and scope of the invention.

What is claimed is:

1. A method for making a semiconductor device structure, comprising:
   producing a substrate having formed thereon a first gate with spacers, a second gate with spacers, respective source and drain regions adjacent to the first gate and the second gate, and an isolation region disposed intermediate of the first gate and the second gate;
   disposing a first metallic layer on the gates with spacers, source and drain regions, and the isolation region;
   disposing a second metallic layer on the first metallic layer;
   covering the second metallic layer to at least a first extent disposed over the first gate with spacers;
   doping the first metallic layer with a first dopant through a portion of the second metallic layer disposed over the second gate with spacers;
   uncovering the at least a first extent of the second metallic layer;
   covering the second metallic layer to at least a second extent disposed over the second gate with spacers;
   doping the first metallic layer with a second dopant through a portion of the second metallic layer disposed over the first gate with spacers;
   uncovering the at least a second extent of the second metallic layer; and
   heating the intermediate structure to a temperature and for a time sufficient to form a silicide of the first metallic layer.

2. The method as claimed in claim 1, further comprising removing the second metallic layer, and then the first metallic layer from the spacers and the isolation region.

3. The method as claimed in claim 1, wherein the first metallic layer has an approximately uniform thickness in a range of about four nanometers to about ten nanometers.

4. The method as claimed in claim 1, wherein the second metallic layer has an approximately uniform thickness in a range of about one nanometer to about five nanometers.

5. The method as claimed in claim 1, wherein the first metallic layer has an approximately uniform thickness of about five nanometers and the second metallic layer has an approximately uniform thickness of about two nanometers.

6. The method as claimed in claim 1, wherein said step of disposing a first metallic layer includes disposing a first metallic layer selected from the group consisting essentially of Ni, Co, Pt, Ti, Er, Yb and alloys.

7. The method as claimed in claim 1, wherein said step of disposing a second metallic layer includes disposing a metallic layer selected from the group consisting essentially of TiN, TaN and W.

* * * * *